United States Patent
Ivankin et al.

(10) Patent No.: US 11,143,960 B2
(45) Date of Patent: Oct. 12, 2021

(54) FABRICATION OF MICRO/NANOSCALE BARCODES USING CANTILEVER-FREE SCANNING PROBE LITHOGRAPHY

(71) Applicant: TERA-PRINT, LLC, Evanston, IL (US)

(72) Inventors: Andrey Ivankin, Chicago, IL (US); Jared A. Magoline, Fond du Lac, WI (US)

(73) Assignee: TERA-PRINT, LLC.

( * ) Notice: Subject to any disclaimer, the term of this patent is extended or adjusted under 35 U.S.C. 154(b) by 240 days.

(21) Appl. No.: 15/996,976

(22) Filed: Jun. 4, 2018

(65) Prior Publication Data
US 2018/0348640 A1     Dec. 6, 2018

Related U.S. Application Data

(60) Provisional application No. 62/514,251, filed on Jun. 2, 2017.

(51) Int. Cl.
*G03F 7/20*     (2006.01)
*G03F 7/00*     (2006.01)

(52) U.S. Cl.
CPC .......... *G03F 7/2059* (2013.01); *G03F 7/0002* (2013.01); *G03F 7/0005* (2013.01)

(58) Field of Classification Search
CPC ..... G03F 7/2059; G03F 7/0002; G03F 7/0005
See application file for complete search history.

(56) References Cited

U.S. PATENT DOCUMENTS

| | | | |
|---|---|---|---|
| 2002/0036235 A1* | 3/2002 | Kudo | G06K 1/126 235/462.01 |
| 2011/0132220 A1 | 6/2011 | Mirkin et al. | |
| 2011/0305996 A1 | 12/2011 | Mirkin et al. | |
| 2015/0286148 A1* | 10/2015 | Mirkin | B05D 1/26 355/67 |

* cited by examiner

*Primary Examiner* — Daborah Chacko-Davis
(74) *Attorney, Agent, or Firm* — Barnes & Thornburg LLP; Steven D. Shipe

(57) ABSTRACT

Cantilever-Free Scanning Probe Lithography (CF-SPL) techniques are used to enable generation of 1-, 2-, 3-, and 4-D information containing patterns in a mask-free manner that, in turn, enables instantaneous change of pattern design.

20 Claims, 3 Drawing Sheets

FABRICATION OF MICRO/NANOSCALE BARCODES USING CANTILEVER-FREE SCANNING PROBE LITHOGRAPHY

CROSS REFERENCE AND PRIORITY CLAIM

This patent application claims priority to U.S. Provisional Applications 62/514,251 filed Jun. 2, 2017, the disclosure of which being incorporated herein by reference in its entirety.

FIELD

Disclosed embodiments provide utility in area of lithography (also known as nano-/micro-fabrication, nano-patterning or nano-printing) methodologies.

BACKGROUND

Presently disclosed embodiments relate to the application of Cantilever-Free Scanning Probe Lithography (CF-SPL) techniques that include, but are not limited to, Polymer Pen Lithography (PPL) and Beam Pen Lithography (BPL) for fabrication of micro/nanoscale barcodes, or other information containing patterns, for example, disclosed in U.S. patent application Ser. No. 12/989,279, filed Apr. 25, 2009, entitled "POLYMER PEN LITHOGRAPHY," and U.S. patent application Ser. No. 13/202,142, filed Feb. 18, 2010, entitled "BEAM PEN LITHOGRAPHY," respectively (the disclosures of each being incorporated by reference in its entirety).

SUMMARY

Presently disclosed embodiments relate to the application of Cantilever-Free Scanning Probe Lithography (CF-SPL) techniques that enable the generation of 1-, 2-, 3-, and 4-D information containing patterns (i.e., X and Y spatial arrangement, size, and color/density of features) in a mask-free manner that in turn allows for an instantaneous change of pattern design.

In accordance with at least one embodiment, Polymer Pen Lithography (PPL) is used to fabricate micro and/or nanoscale barcodes, wherein 'barcode' is described as any information containing pattern that is delivered to an underlying substrate that can be characterized and/or decoded using, but not limited to, optical, magnetic, or thermal readouts depending on the physiochemical nature of the barcode.

In accordance with at least one embodiment, Beam Pen Lithography (BPL) is used to fabricate micro and/or nanoscale barcodes.

In accordance with at least one embodiment, any other variations and/or extensions of CF-SPL techniques are used to fabricate micro and/or nanoscale barcodes.

DETAILED DESCRIPTION

Figure 1:
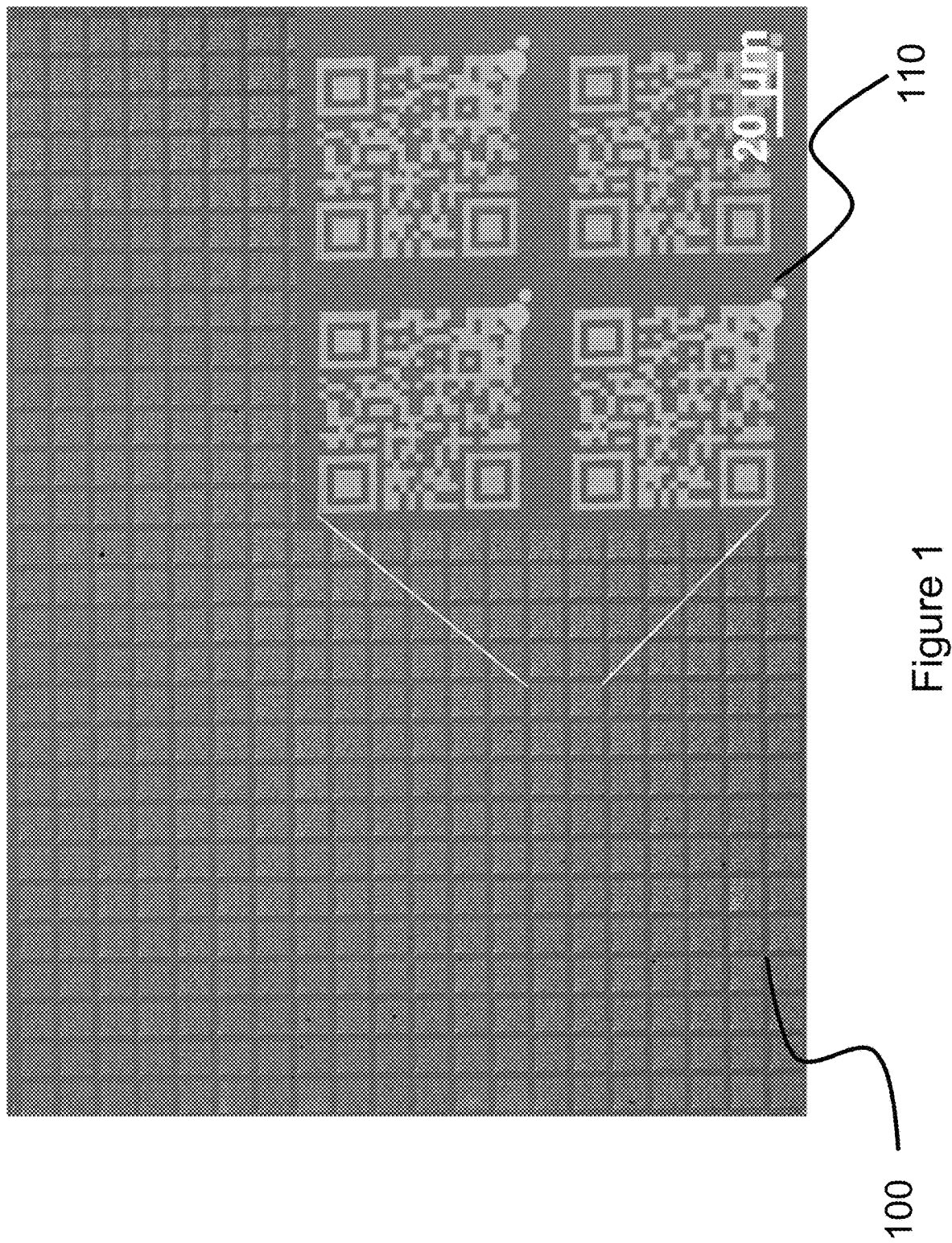
FIG. 1 provides an example of a Quick Read (QR) code patterned in a highly parallel manner with alkylthiols on a gold-covered substrate using a form of a CF-SPL known as, Polymer Pen Lithography (PPL) technique.

As disclosed in the incorporated patent applications, PPL methods of printing indicia on a substrate use a tip array that may comprise elastomeric, compressible polymers, or hard materials, and may be prepared using conventional photolithographic methods and can be tailored to have any desired number and/or arrangement of tips, and numerous copies wherein, e.g., greater than 15,000, or greater than 11 million, of a pattern can be made in a parallel fashion in as little as 10 minutes.

As disclosed in the above identified patent applications, BPL methods of printing indicia on a substrate use a tip array that comprise elastomeric, compressible polymers, or hard materials, just as it would for a traditional PPL array; however, this pen array is coated with an opaque material (i.e., Au, Ag, Ti, Cr, or any other material that will adhere to the elastomeric surface) with the exception of an aperture at the apex of the pyramidal tip (100 nm to 5 µm) that is achieved using common micro and nanofabrication techniques such as photolithography, dry etching, and wet etching. These arrays can be tailored to have any desired number and/or arrangement of tips, and numerous copies wherein, e.g., as few as 5,000, or greater than 500,000 tips can be independently addressed, each of which able to function as its own entity when light is projected through the back of the array in conjunction with a Digital Micromirror Device (DMD), as displayed in FIG. 3, discussed herein. The independent light actuation of each tip is achievable because of the DMD, which enables the generation of numerous, e.g., greater than 5,000 or greater than 500,000, barcodes in parallel, wherein each barcode encodes unique information.

A barcode is an optical, machine-readable representation of data. Originally, barcodes encoded data in one dimension, so-called linear or 1D barcodes, by varying the width and spacing between parallel lines. Later, two-dimensional (2D) codes (also known as "matrix codes") were developed, which utilize rectangles, dots, hexagons, and other geometric patterns in two dimensions to encode data. More recently, new dimensions for encoding information such as color and material identity have been added to the 1D and 2D barcode paradigms. Barcodes can be read using a specialized device or a mobile device with a camera (e.g., smartphone or tablet) and the encoded information can be decrypted using corresponding software.

Conventionally manufactured barcodes have found utility in a number of applications, including tagging and tracking objects (e.g., consumer goods, rental cars, airline luggage, mail and parcels, etc.) and people (e.g., patients in hospitals), advertisement (e.g., Quick Read (QR) codes on public relations materials and packaging and products encoding a link to a web URL with more information), and anti-counterfeiting.

However, most barcodes used today are relatively large in size (visible to the naked eye) and offer very limited protection against counterfeiting because they can be easily copied, recreated, and used on fake or counterfeit products.

One conventional strategy to overcome this problem has been actively pursued and includes the use of chemically unique inks. However, a drawback to this approach is that the formulation of such inks can be reverse engineered by a skillful chemist using commonly available analytical chemistry equipment.

Thus, the need to improve upon current barcoding methods to protect the security and authenticity of such codes continues. Should such a technology exist where the same paradigms currently in place can be utilized in a way that drastically reduces the possibility of forgery, the benefits would be profound.

Accordingly, disclosed embodiments are directed at the technical utility of producing micro and/or nanoscale barcodes using Cantilever-Free Scanning Probe Lithography (CF-SPL) techniques. Such an approach enables the ability to mass produce and significantly miniaturize barcodes to the point that modern consumer technology and instrumentation would not be able to create them, requiring the use of advanced micro/nanofabrication equipment, while preserving the macroscale information encoding principles.

Miniaturization of barcodes may also be beneficial in a range of applications where the size of a target object is small (e.g., electronics components, pharmaceutical drugs, medical components or devices for introduction into a subject's body, etc.) or the tag advantageously has little or minimum impact on the object being tagged (e.g., art, jewelry, currency, legal documents, etc.). While a number of existing micro/nanofabrication techniques, such as electro-hydrodynamic ink-jet printing, scanning probe lithography, and electron beam lithography, are capable of generating small barcodes (sub-100 micron in size), the sacrifice made in terms of throughput, materials generality and mask design dependence renders these strategies economically unviable.

To the contrary, disclosed embodiments provide a technical improvement and application of (CF-SPL) techniques so as to enable more efficient and commercially effective manufacturing of micro and/or nanoscale barcodes and other tags, while also providing additional means for encoding information, i.e. control of the feature density and composition.

FIG. 1 provides an illustration of an example of a Quick Read (QR) code patterned in high density (e.g., tens of thousands in 1×1 cm$^2$) with alkylthiols on a gold-covered substrate using PPL technique. As shown in FIG. 1, the main image 100 is the optical image (5× magnification) showing hundreds of copies of patterned QR codes. The insert 110 provided in FIG. 1 is a 20× magnified image demonstrating the functionality of the manufactured QR code. It should be noted that the code can be scanned with a smartphone with a camera using a conventional QR code reading technology.

Recent advances in scanning probe lithography disclosed in U.S. patent application Ser. No. 12/989,279, filed Apr. 25, 2009, entitled "POLYMER PEN LITHOGRAPHY" and U.S. patent application Ser. No. 13/202,142, filed Feb. 18, 2010, entitled "BEAM PEN LITHOGRAPHY," referenced above and made by Dr. Chad Mirkin of the International Institute for Nanotechnology at Northwestern University, and coworkers for the first time enable a cost-effective and high-throughput method for producing micro/nanoscale barcodes. In an important departure from conventional cantilever-based paradigm, Mirkin and coworkers invented cantilever-free scanning probe lithography (CF-SPL), a technique that relies on a new architecture in which the cantilever is replaced with an inexpensive elastomeric film with anywhere from thousands to millions of pyramidal tips on a rigid substrate, affording massive scaling, while preserving high resolution.

Figure 3:
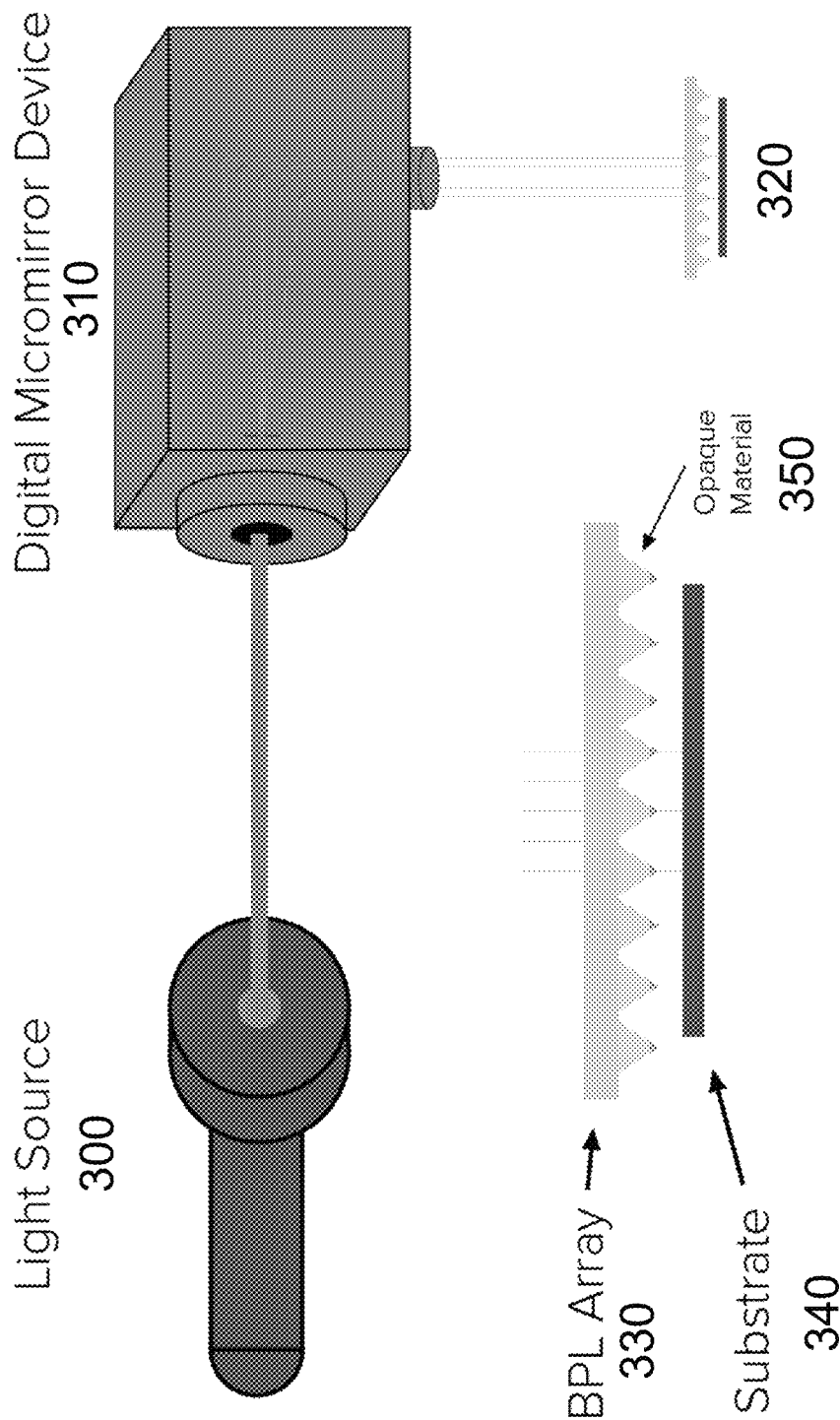
FIG. 3 illustrates one example of integration of a light source and Digital Micromirror Device (DMD) to the CF-SPL platform (e.g., BPL) in accordance with the disclosed embodiments.

Accordingly, massively parallel tip arrays can be used for direct molecular printing—a technique known as Polymer Pen Lithography (PPL), or diffraction-unlimited patterning with light when combined with near- and far-field photolithography—a method known as Beam Pen Lithography (BPL). It is important to note that, in BPL, thousands of individual tips can be addressed in an independent manner as a result of integrating a Digital Micromirror Device (DMD) into the light path (FIG. 3). This allows for the generation of tens of thousands of unique barcodes, or other information-containing patterns, to be printed in parallel.

These CF-SPL techniques enable the fabrication of tens of thousands to millions of sub-100 micron barcodes in replica when using PPL, or individually unique using BPL owing to the fact that each tip of the array can pattern independently of the rest.

As a proof-of-experiment, tens of thousands of copies of a Quick-Read (QR) code have been manufactured (40×40 μm$^2$ in size) by patterning alkylthiols on a gold-covered Si/SiO$_2$ wafer (1.0×1.0 cm$^2$) using PPL technique in less than an hour (as illustrated in FIG. 1).

The optical image of the QR code (20× magnified) demonstrates that the encoded information can be read in the same way as with macroscale QR codes simply by using a smartphone and any common QR code reading app. Such a substrate with tens of thousands of QR codes, or any barcodes, can be easily diced into units as small as 100×100 μm$^2$ and attached to any product of interest using commercially available services.

Although that example demonstrates the use of only one ink-substrate pair, CF-SPL techniques have proven to be compatible with a broad range of organic and inorganic inks (e.g., alkylthiols, block copolymers, metal nanoparticles, DNA, proteins, etc.) and substrates (e.g., quartz, Iridium Tin Oxide (ITO) coated glass, silicon and silicon oxide surfaces, etc.). Therefore, the ink-substrate combination can be fine-tuned to offer physicochemical properties of the barcode compatible with an ultimate application. For instance, the barcode can be made resistant to harsh environmental conditions, such as extreme humidity, temperature, and chemical transformation; or use of unique inks that are only visible in UV, NUV, NIR, or IR range.

From a manufacturing efficiency standpoint, CF-SPL is a mask-free technology, which is technically significant because it means the design of each pattern can be changed without the need to fabricate a pre-designed mask first—a common practice and requirement in many other micro/nanofabrication techniques. Furthermore, CF-SPL techniques enable control of patterned feature size from sub-100 nm to a few microns simply by, for example, adjusting the force of contact between the tip and the substrate, duration of the contact, or duration of the light exposure in the case of BPL.

Accordingly, it should be understood that the feature size and/or the density of features per unit area may be controlled similar to the color and chemical identity to a two-dimensional space for encoding information on micro/nanoscale. Such technical innovation further thwarts conventional forgery or counterfeiting efforts because of the technical difficulty in reproduction.

Thus, the disclosed embodiments' use of CF-SPL provides is a very powerful, flexible, and highly scalable approach to fabricating micro/nanoscale barcodes for a broad range of applications that offer superb anti-counterfeit protection in a cost effective manner.

Figure 2:
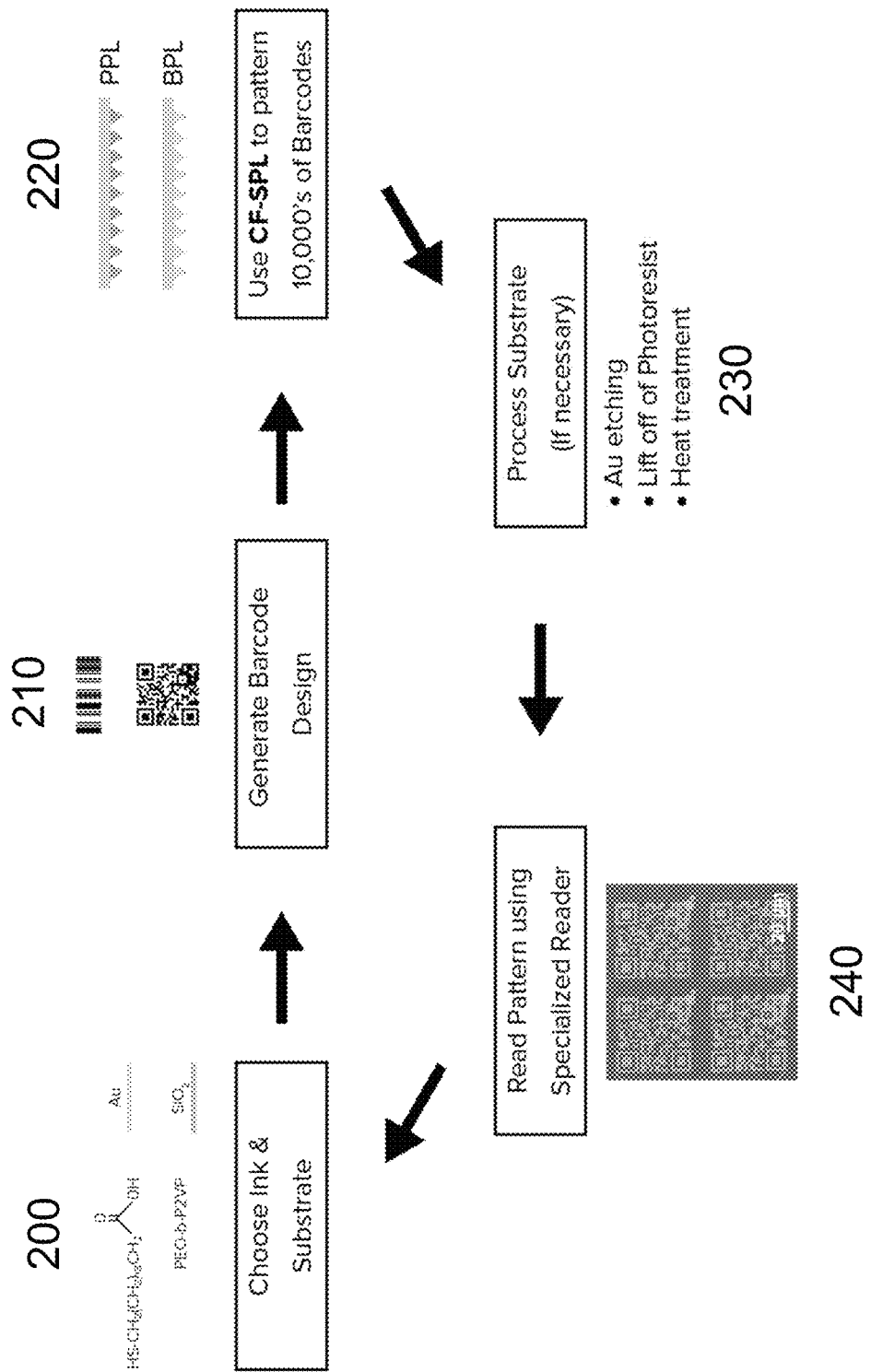
FIG. 2 provides a flowchart outlining operations performed to fabricate any type of barcode using the CF-SPL platform in accordance with the disclosed embodiments.

FIG. 2 provides a flowchart outlining operations performed to fabricate any type of barcode using the CF-SPL platform in accordance with the disclosed embodiments. This chart highlights a few options for substrates, inks, types of barcodes, etc.; however, it should be noted that any type of information containing pattern disclosed in this document follows the same flowchart, thus, should be considered recognized in the same light. As shown in the flow chart, operations begin at 200, at which ink and substrate materials are selected and control proceeds to 210, at which a barcode design is generated. Subsequently, at 220, CFR-SPL is used to generate 10,000's of barcodes. Control then proceeds to substrate processing, e.g., Au etching, lift off of photoresist and/or heat treatment. It should be understood that these substrate processes are optional and may not be necessary, depending on the barcode being fabricated. Control then proceeds to 240 at which the generated pattern may be read using a specialized reader to ensure quality control and/or for subsequent use. Subsequently, the operations may be performed again, in repetition with the same or a new barcode design.

FIG. 3 illustrates one example of integration of a light source 300 and a Digital Micromirror Device (DMD) 310 to the CF-SPL platform (e.g. BPL), to individually actuate pens of interest within a BPL array 330 and generate as many as thousands of unique barcodes on a substrate 340 simultaneously in accordance with the disclosed embodiments. As shown in FIG. 3, the pen array 330 is coated with an opaque material 350 (i.e. Au, Ag, Ti, Cr, or any other material that will adhere to the elastomeric surface) with the exception of an aperture at the apex of the pyramidal tip (100 nm to 5 µm) that is achieved using common micro and nanofabrication techniques such as photolithography, dry etching, and wet etching.

It should be understood that the presently disclosed innovations may be incorporated into a lithography instrument including constituent components operating in cooperation under the control of a control unit. An exhaustive, detailed description of conventionally available and understood lithography, nano-fabrication, nano-printing and nano-patterning technology is not provided herein because it is within the level of skill of one of ordinary skill in the art.

Thus, generally speaking, it should be understood that such a lithographic instrument may include an alignment apparatus, a substrate holder, a pen array and array holder all coupled to and under control of a control unit, which may include software implemented using one or more general or specific purpose computers, including memory. The control unit may also, optionally, control operation of one or more lithographic manufacturing modules for performing, lithography, nano-fabrication, nano-patterning and/or nano-printing. Such lithographic manufacturing technology is within the skill level of one of ordinary skill in the art. Such lithographic manufacturing technology presently known and later developed techniques for direct molecular printing, e.g., PPL, or BPL, for example.

Those skilled in the art will recognize, upon consideration of the above teachings, that the above exemplary embodiments may perform the above-specified operations (and those referred in the claims) under the control of the control unit that may utilize or be based upon use of one or more programmed processors programmed with a suitable computer program or similar functionality. However, the disclosed embodiments could utilize one or more control units implemented using hardware component equivalents such as special purpose hardware and/or dedicated processors. Similarly, general purpose computers, microprocessor based computers, micro-controllers, optical computers, analog computers, dedicated processors, application specific circuits and/or dedicated hard wired logic may be used to construct alternative equivalent embodiments. It should be understood that the operations explained herein may be implemented in conjunction with, or under the control of, one or more general purpose computers running software algorithms to provide the presently disclosed functionality and turning those computers into specific purpose computers.

It should be understood that control and cooperation of components of the lithographic instrument designed in accordance with the disclosed embodiments may be provided using software instructions that may be stored in a tangible, non-transitory storage device such as a non-transitory computer readable storage device storing instructions which, when executed on one or more programmed processors, carry out the above-described method operations and resulting functionality. In this case, the term "non-transitory" is intended to preclude transmitted signals and propagating waves, but not storage devices that are erasable or dependent upon power sources to retain information.

Those skilled in the art will appreciate, upon consideration of the above teachings, that the program operations and processes and associated data used to implement certain of the embodiments described above can be implemented using disc storage as well as other forms of storage devices including, but not limited to non-transitory storage media (where non-transitory is intended only to preclude propagating signals and not signals which are transitory in that they are erased by removal of power or explicit acts of erasure) such as for example Read Only Memory (ROM) devices, Random Access Memory (RAM) devices, network memory devices, optical storage elements, magnetic storage elements, magneto-optical storage elements, flash memory, core memory and/or other equivalent volatile and non-volatile storage technologies without departing from certain embodiments of the present invention. Such alternative storage devices should be considered equivalents.

While this invention has been described in conjunction with the specific embodiments outlined above, it is evident that many alternatives, modifications and variations will be apparent to those skilled in the art. Accordingly, the various embodiments of the invention, as set forth above, are intended to be illustrative, not limiting. Various changes may be made without departing from the spirit and scope of the invention.

For example, the invention is not limited to alkanethiols. Any adsorbate can be used, as long as it adheres to the surface to form a code with chemical, physical, mechanical, or thermal properties that can be detected, or observed with a reader. A key is their size and thickness (all of which is on the nanoscopic scale).

Additionally, it should be understood that the functionality described in connection with various described components of various invention embodiments may be combined or separated from one another in such a way that the architecture of the invention is somewhat different than what is expressly disclosed herein. Moreover, it should be understood that, unless otherwise specified, there is no essential requirement that methodology operations be performed in the illustrated order; therefore, one of ordinary skill in the art would recognize that some operations may be performed in one or more alternative order and/or simultaneously.

It is to be understood that other embodiments may be utilized and structural and functional modifications may be made without departing from the scope and spirit of the present invention.

Moreover, it should be understood that various connections are set forth between elements in the above description; however, these connections in general, and, unless otherwise specified, may be either direct or indirect, either permanent or transitory, and either dedicated or shared, and that this specification is not intended to be limiting in this respect.

We claim:

1. A Cantilever-Free Scanning Probe Lithography (CF-SPL) technique, comprising: using lithography and a CF-SPL platform to fabricate at least one information containing pattern, while controlling feature density and composition, wherein the at least one information containing pattern includes micro- and/or nano-scale features that encode information of the at least one information containing pattern based on physicochemical properties of the features that are detectable or observable to read the encoded information, wherein information encoded based on physicochemical properties of the features includes formation of the features using at least one of chemical, physical, mechanical, or thermal properties that are detectable or observable by reader to read the encoded information.

2. The technique of claim 1, wherein the lithography is Polymer Pen Lithography (PPL), Beam Pen Lithography (BPL), or any other technique which is enabled by the CF-SPL platform.

3. The technique of claim 1, wherein fabrication includes direct contact molecular printing.

4. The technique of claim 1, wherein light is introduced into the system to perform diffraction-unlimited near- and far-field photolithography to fabricate the at least one information containing pattern.

5. The technique of claim 4, wherein a Digital Micromirror Device is integrated into a light path between the light source and the BPL array to address a plurality of individual tips of the parallel tip arrays in an independent manner.

6. The technique of claim 5, wherein the at least one information containing pattern includes a plurality of unique information containing patterns fabricated by the technique, wherein the technique fabricates the plurality of unique information containing patterns in parallel.

7. The technique of claim 1, wherein each tip of the array patterns simultaneously, and in the case of BPL independently, of the rest of the plurality of tips.

8. The technique of claim 1, wherein the at least one information containing pattern includes an optically, magnetically, mechanically, or thermally detectable unique arrangement of molecules or material that can be interpreted by a machine-reader.

9. The technique of claim 8, wherein the at least one information containing pattern is a barcode, RFID, or other arrangement of molecules that can encode information to be interpreted by a reader.

10. The technique of claim 9, wherein the reader is an optical, magnetic, or thermal reader.

11. The technique of claim 9, wherein the barcode is multi-dimensional.

12. The technique of claim 1, wherein at least one information containing pattern is four dimensional, including the physicochemical property to specify X and Y axis spatial arrangement, feature size, color/density/chemical identity of features.

13. The technique of claim 1, wherein the technique is performed in a mask-free manner such that pattern design may be instantaneously changed.

14. The technique of claim 1, wherein the fabrication of the at least one information containing pattern is performed in a parallel manner so as to perform either simultaneous patterning of the same information containing pattern, or independent actuation of many tips that deposit, or define a number of unique information containing patterns.

15. The technique of claim 1, wherein fabrication is performed with an adsorbate that interacts with an underlying substrate.

16. The technique of claim 1, wherein fabrication uses an adsorbate that adheres, etches, or modifies the substrate surface to define a barcode of any sort.

17. A lithography instrument utilizing a Cantilever-Free Scanning Probe Lithography (CF-SPL) technique, the lithography instrument comprising a control system and an tip array, wherein the control system is configured to perform lithography and a CF-SPL platform to fabricate at least one information containing pattern, while controlling feature density and composition, and wherein the at least one information containing pattern includes micro and/or nanoscale features that encode information of at least one information containing pattern based on physicochemical properties of the features that can be detected or observed by a reader to read the encoded information, wherein information encoded based on physicochemical properties of the features includes formation of the features using at least one of chemical, physical, mechanical, or thermal properties that are detectable or observable to read the encoded information.

18. The lithography instrument of claim 17, wherein the lithography is at least one of Polymer Pen Lithography (PPL), Beam Pen Lithography (BPL), or any other technique which is enabled by the CF-SPL platform.

19. The lithography instrument of claim 18, wherein the control system is configured to perform direct contact molecular printing.

20. The lithography instrument of claim 18, wherein the control system is configured to govern light introduced into the system to perform diffraction-unlimited patterning with light and operations combined with near- and far-field photolithography to perform Beam Pen Lithography (BPL) to fabricate the at least one information containing pattern.

* * * * *